Sept. 20, 1966 HISAO MAEDA 3,274,506

TRANSISTOR TYPE BROAD BAND AMPLIFIER UTILIZING A CHOKE COIL

Filed May 29, 1963

United States Patent Office 3,274,506 Patented Sept. 20, 1966

3,274,506
TRANSISTOR TYPE BROAD BAND AMPLIFIER UTILIZING A CHOKE COIL

Hisao Maeda, 211 Minamisenzoku-machi, Ota-ku, Tokyo-to, Japan
Filed May 29, 1963, Ser. No. 284,231
Claims priority, application Japan, June 13, 1962, 37/30,442
1 Claim. (Cl. 330—21)

This invention relates to super broad band high frequency amplifiers wherein transistors are employed.

Figure 1:
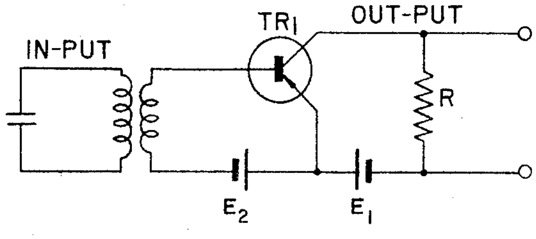
Fig. 1 PRIOR ART

In conventional transistor type broad band amplifier circuits, such as shown in FIG. 1, the circuit comprises an input circuit (IN-PUT) including a capacitor and a coupling transformer, the input signal or input power coupling circuit of said circuit being omitted in FIG. 1, a transistor amplifier $TR_1$, and an output circuit (OUT-PUT). If a load resistance R of approximately 10 k.Ω is inserted, as shown in FIG. 1, it becomes possible to attain current amplification of relatively flat characteristics throughout a super broad band ranging from approximately 10 kc. up to substantially 10 mc. However, if the amplifier circuit is to be connected with the succeeding amplifier stage, matching of the output impedance in the preceding stage with the input impedance in the succeeding stage becomes very difficult. For this reason, matching heretofore has been accomplished by utilizing a complex and expensive impedance matching transformer.

Figure 2:
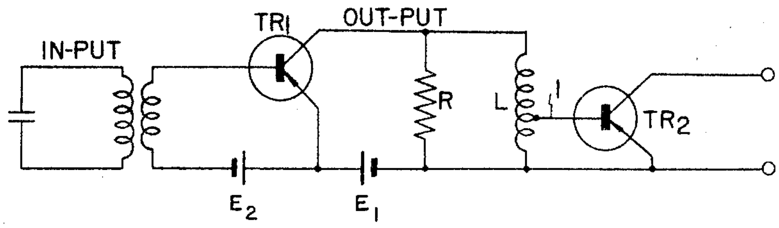

It is a major objective of the present invention therefore to provide a simple and economical circuit which permits amplification throughout a super broad band range and easy impedance matching with the succeeding stage. This and other objects will become apparent from a study of the specification drawings attached hereto and in which:

FIG. 1 represents a connection diagram of a transistorized amplifier circuit (the D.C. circuitry is not shown); and FIG. 2 shows a connection diagram of the super broad band high frequency amplifier circuit of the present invention. (The D.C. circuitry is abbreviated.)

Referring to the transistorized amplifier circuit in FIG. 2, the essence of the present invention can be seen as essentially consisting of the connection in parallel of a high-frequency choke coil L provided with a tap—to a load resistance R in the output circuit, the tap 1 being connected to the base side of the transistor $TR_2$ in the succeeding stage. The salient feature of the invention is the elimination of other elements.

In accordance with the present invention, a high frequency choke coil L provided with a tap 1 is used instead of a load resistance matching transformer coupled to the input circuit of the succeeding stage. Since the lead from the tap 1 is connected to the base side of the transistor $TR_2$ in the succeeding stage, it is readily seen that the output impedance of the transistor $TR_1$ in the preceding stage can be easily matched to the input impedance of the succeeding stage. Accordingly, it becomes obvious that current amplification can be efficiently effected through an extremely simple circuit. Moreover, the amplifier circuit of the present invention obviates the use of any super broad band compound transformer and provides, furthermore, the means for substantial economies and practical benefits by using a cheap and simple choke coil.

The inductance of the high-frequency choke coil L has a definite line-distributed capacitance, so that this inductance may generally be represented as impedance. The impedance of coil L which is parallel to the load resistance R preferably is higher than the resistance R because otherwise an increase in gain occurs. Hence, the lower limit of the super broad band is limited by the line-distributed capacity, i.e., the capacity between each adjacent turns of the inductance coil, so that widening of the band width depends upon the construction of the high frequency choke coil.

The embodiments cited herein are given obviously for purposes of illustration and not of limitation and it is understood that various modifications are conceivable without departing from the spirit of the present invention.

What is claimed is:

In a multistage transistor type broad band amplifier circuit consisting of at least two stages in which at least the preceding amplifier circuit stage includes a load resistance connected in parallel to the output circuit thereof, the improvement consisting of a network connected between the output terminal of said preceding stage and the base of the transistor of the succeeding stage, said network consisting of a high frequency choke coil connected in parallel to said load resistance; said choke coil provided with a tap and said tap connected to the base of the transistor of the succeeding amplifier circuit stage.

References Cited by the Examiner

FOREIGN PATENTS 1,098,041 1/1961 Germany.

OTHER REFERENCES

Garner: Transistor Circuit Handbook, 1956, Coyne Electrical School, Chicago, Ill. p. 57.

ROY LAKE, *Primary Examiner.*

F. D. PARIS, *Assistant Examiner.*